(12) United States Patent
Guo et al.

(10) Patent No.: US 12,117,648 B2
(45) Date of Patent: Oct. 15, 2024

(54) HYBRID INTEGRATION METHOD

(71) Applicant: Huazhong University of Science and Technology, Wuhan (CN)

(72) Inventors: Weihua Guo, Wuhan (CN); Xiangyang Dai, Wuhan (CN); Qiaoyin Lu, Wuhan (CN)

(73) Assignee: Huazhong University of Science and Technology, Wuhan (CN)

( * ) Notice: Subject to any disclaimer, the term of this patent is extended or adjusted under 35 U.S.C. 154(b) by 455 days.

(21) Appl. No.: 17/680,267

(22) Filed: Feb. 24, 2022

(65) Prior Publication Data

US 2023/0141467 A1 May 11, 2023

(30) Foreign Application Priority Data

Nov. 8, 2021 (CN) .......................... 202111313111.4

(51) Int. Cl.
| | |
|---|---|
| *G02B 6/13* | (2006.01) |
| *G02B 6/122* | (2006.01) |
| *H05K 1/14* | (2006.01) |
| *H05K 3/36* | (2006.01) |

(52) U.S. Cl.
CPC ............. *G02B 6/13* (2013.01); *G02B 6/1228* (2013.01); *H05K 1/144* (2013.01); *H05K 3/368* (2013.01); *H05K 2201/041* (2013.01); *Y10T 29/4913* (2015.01)

(58) Field of Classification Search
CPC ........ G02B 6/13; G02B 6/43; G02B 6/12004; G02B 6/387; Y10T 29/49126; Y10T 29/4913
USPC .......................................... 29/832, 829, 831
See application file for complete search history.

(56) References Cited

U.S. PATENT DOCUMENTS

| | | | |
|---|---|---|---|
| 9,523,822 B2 * | 12/2016 | Miller | G02B 6/3849 |
| 10,725,254 B2 * | 7/2020 | Shastri | G02B 6/4249 |
| 11,637,355 B1 * | 4/2023 | Zhang | H01P 1/32 |
| | | | 333/24.1 |

\* cited by examiner

*Primary Examiner* — Thiem D Phan
(74) *Attorney, Agent, or Firm* — MATTHIAS SCHOLL P.C.; Matthias Scholl

(57) ABSTRACT

A hybrid integration method includes: assembling a motherboard chip, assembling a daughterboard chip, and assembling an integrated chip. The motherboard chip includes a motherboard chip body, a first metal region, a first vertical support assembly, and a first waveguide region arranged on the motherboard chip body, and the first waveguide region includes a first conventional waveguide region and a first coupling waveguide region used for vertical coupling which are fixedly connected to each other; the daughterboard chip includes a daughterboard chip body, a second metal region, a second vertical support assembly and a second waveguide region arranged on the daughterboard chip body, and the second waveguide region includes a second conventional waveguide region and a second coupling waveguide region used for vertical coupling which are fixedly connected to each other.

7 Claims, 7 Drawing Sheets

HYBRID INTEGRATION METHOD

CROSS-REFERENCE TO RELATED APPLICATIONS

Pursuant to 35 U.S.C. § 119 and the Paris Convention Treaty, this application claims foreign priority to Chinese Patent Application No. 202111313111.4 filed Nov. 8, 2021, the contents of which, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, MA 02142.

BACKGROUND

The disclosure relates to the field of optical integration, and more particularly to a hybrid integration method of constructing a photonic integrated circuit with two or more materials.

With the rapid development of integrated optical circuits in the optical fiber communication field, the integration of lasers, modulators, and detectors on a single chip is a development trend for achieving the objectives of miniaturization, low power consumption and low cost. At present, the integrated optical circuits can adopt many material systems. For example, active devices mainly adopt indium phosphide, gallium arsenide and gallium nitride, and passive devices mainly adopt silicon, silicon nitride, silicon oxide, aluminum nitride, lithium niobate, etc. As an indirect bandgap semiconductor material, silicon cannot become a light source. In addition, due to two-photon absorption, silicon cannot also be applied in non-linear optics. However, the disadvantages of silicon in these aspects are avoidable in other material systems. Therefore, it is universally recognized that different materials are mixed and integrated to achieve best integrated optical circuits.

There are many ways to integrate optical materials, for example, hybrid integration including flip-chip integration and transfer printing, and heterogeneous integration including die and wafer bonding, thin-layer evaporation and direct growth. The heterogeneous integration technologies for materials have very strict requirements for wafer quality, semiconductor manufacturing equipment and technology, ultra-clean environment and other conditions, leading to high development cost in the early stage and technical difficulties. The hybrid integration technology (particularly flip-chip integration) can optimize discrete chips independently, and the devices with best performance are selected for hybrid integration in early tests, so that the yield is high.

However, the biggest problem of flip-chip integration is the optical coupling between different material systems. Grating coupling cannot meet the operation bandwidth of the whole C band; mirror coupling is high in processing difficulty and generally performed at the tail ends of chips; and, the coupling efficiency of butt coupling is limited by end face quality, end face reflection and three-dimensional alignment error. At present, commercial Flip-chip platforms can realize an alignment error within 500 nm in two horizontal directions by using alignment marks, but the alignment in the vertical direction is still challenging and has high requirements for substrate thickness and material etching uniformity. Moreover, since different materials have different thermal expansion coefficients, the change in temperature will inevitably lead to the misalignment of the butting part for the hybrid integrated device in the vertical direction.

On the other hand, at present, spot-size converters are more widely used to amplify alignment spots, so that it is advantageous for direct butting to a certain extent. However, there are always gaps between end faces, so the coupling efficiency will be decreased. Moreover, the three-dimension alignment tolerance is stringent, and the theoretical optical coupling loss within an alignment error of $\pm 1$ μm is $-2.3$ dB. In addition, how to reduce the end face reflection during the direct butting of waveguides is also a problem. No matter on an etching interface or a cleavage surface, some end face light will be reflected back to the active device to seriously affect the performance of the device. The integration of an optical isolator on chip is also difficult.

SUMMARY

The disclosure provides a hybrid integration method, the method comprising:

assembling a motherboard chip, the motherboard chip comprising a motherboard chip body, a first metal region, a first vertical support assembly, and a first waveguide region being arranged on the motherboard chip body, and the first waveguide region comprising a first conventional waveguide region and a first coupling waveguide region used for vertical coupling which are fixedly connected to each other;

assembling a daughterboard chip, the daughterboard chip comprising a daughterboard chip body, a second metal region, a second vertical support assembly and a second waveguide region being arranged on the daughterboard chip body, and the second waveguide region comprising a second conventional waveguide region and a second coupling waveguide region used for vertical coupling which are fixedly connected to each other; and assembling an integrated chip: fitting the daughterboard chip upside down to the top end of the motherboard chip, fitting the first vertical support assembly to the second vertical support assembly, fitting or approaching the first coupling waveguide region to the second coupling waveguide region to form a vertical waveguide coupler, and fixedly connecting the first metal region to the second metal region.

In a class of this embodiment, during assembling an integrated chip, the first coupling waveguide region is fitted or approached to the second coupling waveguide region to form a vertical waveguide coupler; light enters the first coupling waveguide region from the first conventional waveguide region, then transits from the first coupling waveguide region to the second coupling waveguide region through the vertical waveguide coupler, and enters the second conventional waveguide region from the second coupling waveguide region; or, light enters the second coupling waveguide region from the second conventional waveguide region, then transits from the second coupling waveguide region to the first coupling waveguide region through the vertical waveguide coupler, and enters the first conventional waveguide region from the first coupling waveguide region.

In a class of this embodiment, during assembling an integrated chip, a principle of optical coupling after the first coupling waveguide region is fitted or approached to the second coupling waveguide region comprises directional coupling, evanescent coupling or adiabatic coupling.

In a class of this embodiment, during assembling an integrated chip, the second conventional waveguide region and the first conventional waveguide region are arranged on two sides of the vertical waveguide coupler, respectively.

In a class of this embodiment, during assembling an integrated chip, a manner of fixedly connecting the first metal region to the second metal region comprises eutectic welding or metal bonding.

In a class of this embodiment, during assembling an integrated chip, a manner of forming the first metal region and the second metal region comprises metal evaporation, sputtering or electroplating.

In a class of this embodiment, during assembling an integrated chip, the fixed connection between the first metal region and the second metal region neither hinders the fitting of the second vertical support assembly with the first vertical support assembly nor hinders the fitting or approach of the first coupling waveguide region to the second coupling waveguide region.

The following advantages are associated with the hybrid integration method of the disclosure. Specifically, a daughterboard chip is fitted upside down to a motherboard chip, and a second coupling waveguide region is closely fitted or approached to a first coupling waveguide region to form a waveguide vertical coupling state, so that light can be transmitted from the daughterboard chip coupling region to the first coupling waveguide region or from the first coupling waveguide region to the second coupling waveguide region. Thus, hybrid integration is realized by the flip-chip bonding of the motherboard chip and the daughterboard chip and in combination with waveguide vertical coupling. The second coupling waveguide region and the first coupling waveguide region can come into close contact with each other as a support region in the vertical direction during the flip-chip bonding, to form a vertical coupler. Thus, efficient optical coupling is realized by double waveguides formed by completely contacting the second coupling waveguide region with the first coupling waveguide region, and a larger alignment tolerance is achieved. The corresponding metal regions on the daughterboard chip and the motherboard chip are fixedly connected by eutectic welding or metal bonding, so that the daughterboard chip and the motherboard chip are fixedly connected. In accordance with the disclosure, the alignment tolerance between optical chips is increased, and the light loss and light reflection are reduced.

Figure 1:
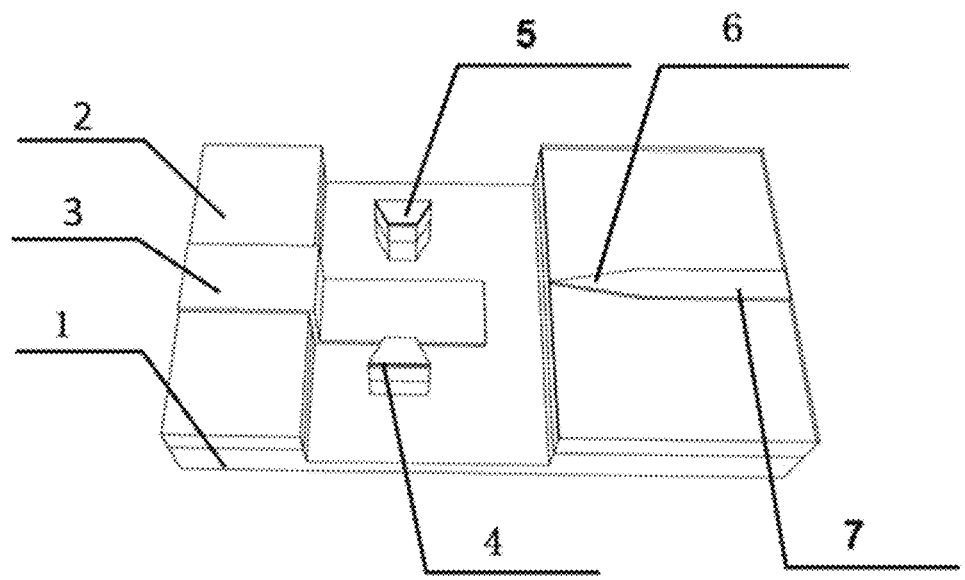
FIG. 1 is a schematic structure diagram of an optical motherboard chip according to Example 1 of the disclosure.
Figure 2:
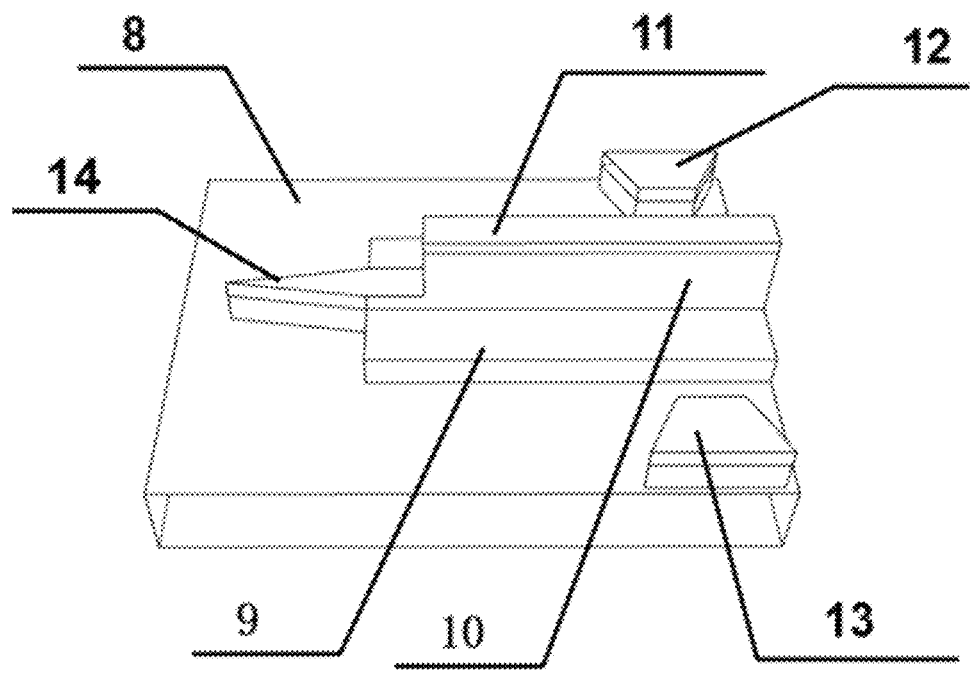
FIG. 2 is a schematic structure diagram of an optical daughterboard chip according to Example 1 of the disclosure.
Figure 3:
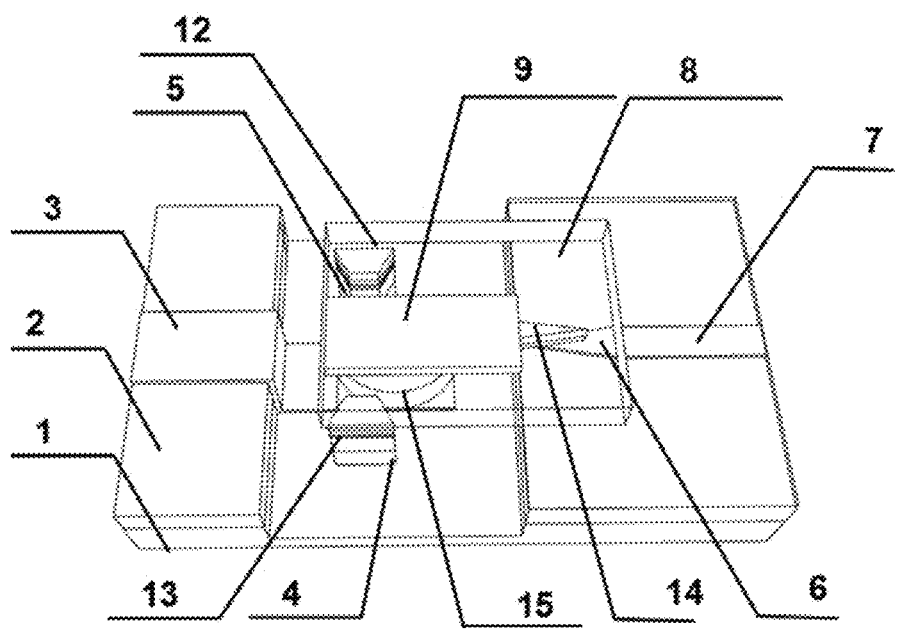
FIG. 3 is a schematic structure diagram of a device after hybrid integration according to Example 1 of the disclosure.
Figure 4:
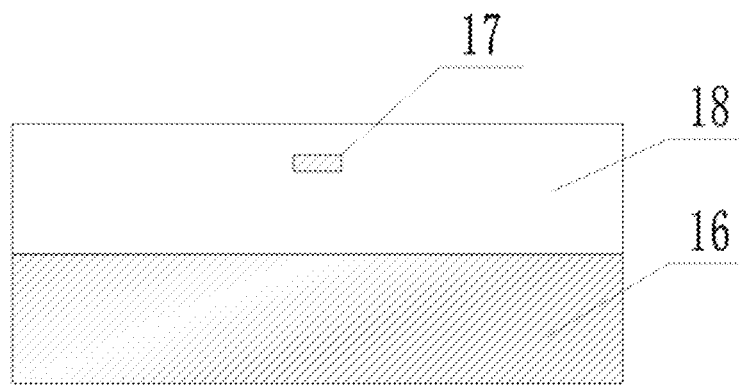
FIG. 4 is a sectional view of an optical first coupling waveguide region according to Example 1 of the disclosure.
Figure 5:
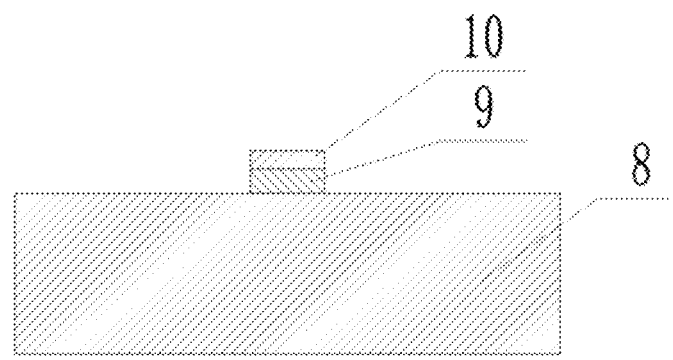
FIG. 5 is a sectional view of an optical second coupling waveguide region according to Example 1 of the disclosure.
Figure 6:
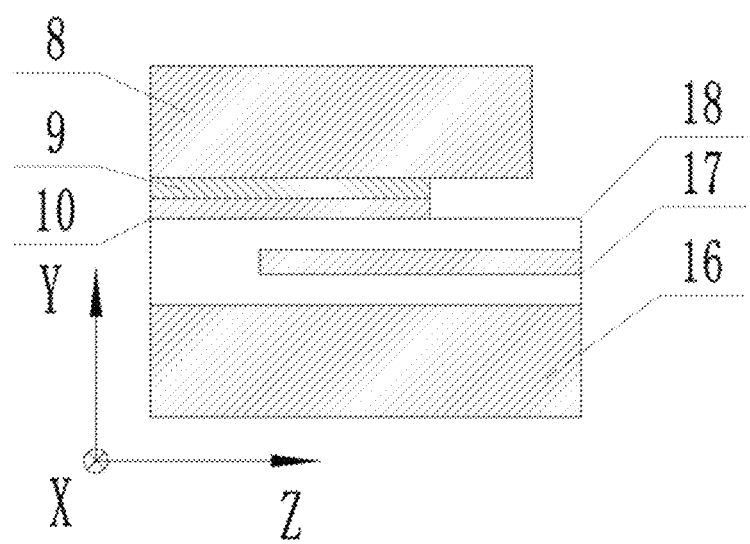
FIG. 6 is a schematic structure diagram of a coupling waveguide region after hybrid integration according to Example 1 of the disclosure.
Figure 7:
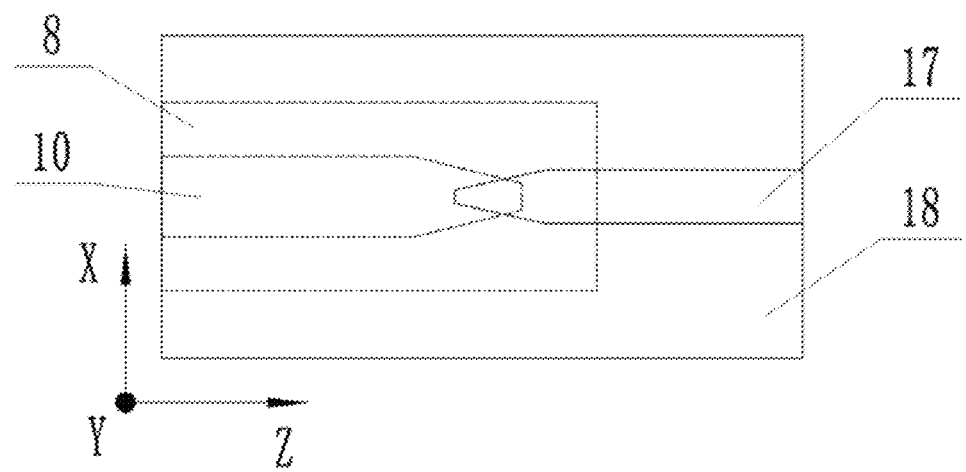
FIG. 7 is a top view of the coupling waveguide region after hybrid integration according to Example 1 of the disclosure.
Figure 8:
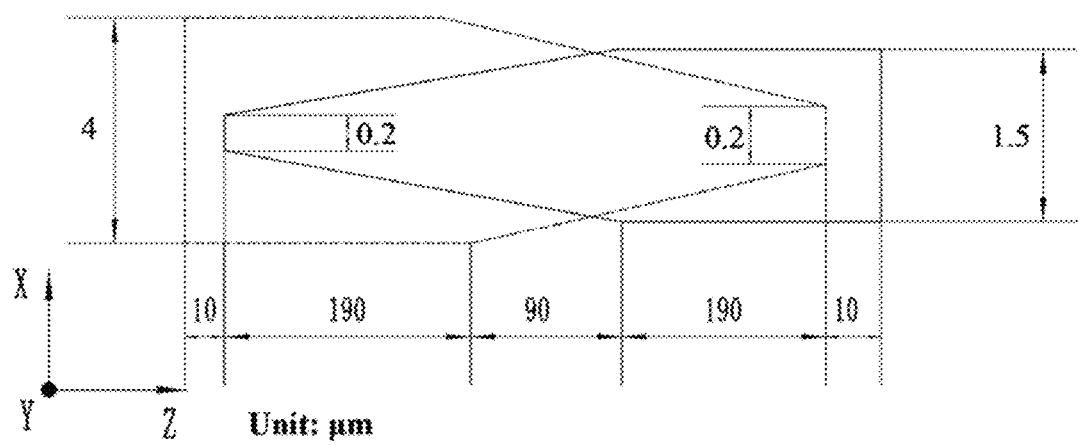
FIG. 8 is a schematic diagram of parameters of the coupling waveguide region after hybrid integration according to Example 1 of the disclosure.
Figure 9:
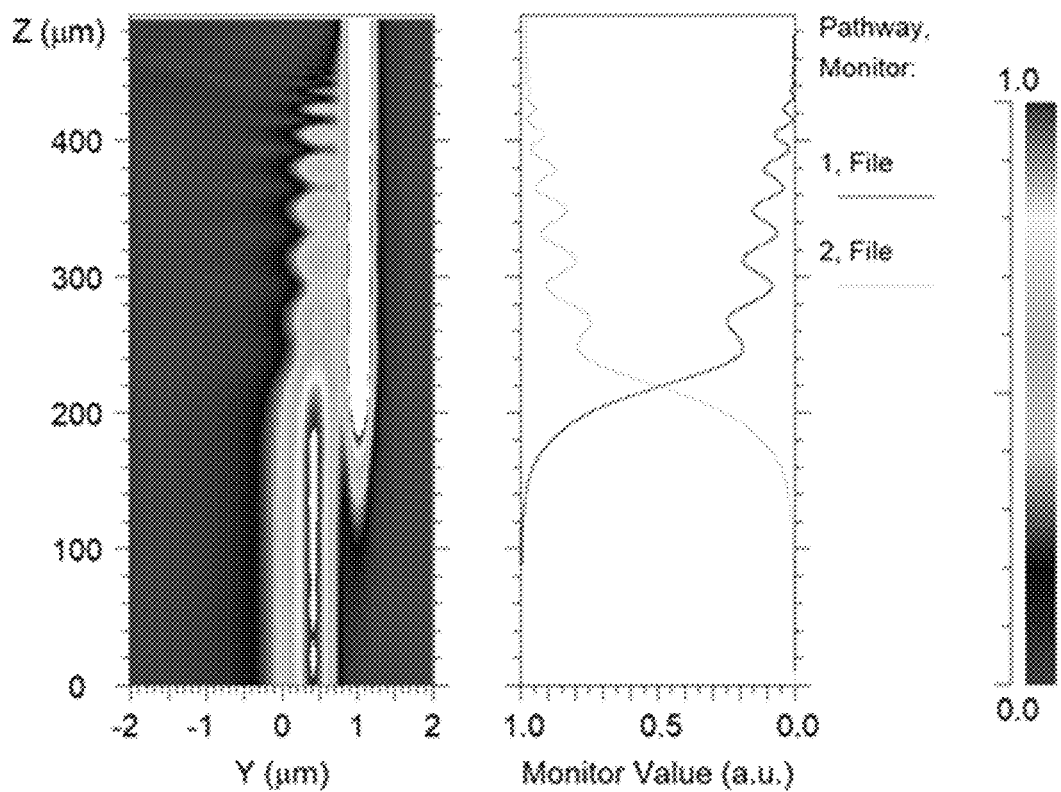
FIG. 9 is a simulation calculation of the transmission efficiency of light coupling from a second waveguide region to a first waveguide region by a beam propagation method according to Example 1 of the disclosure.
Figure 10:
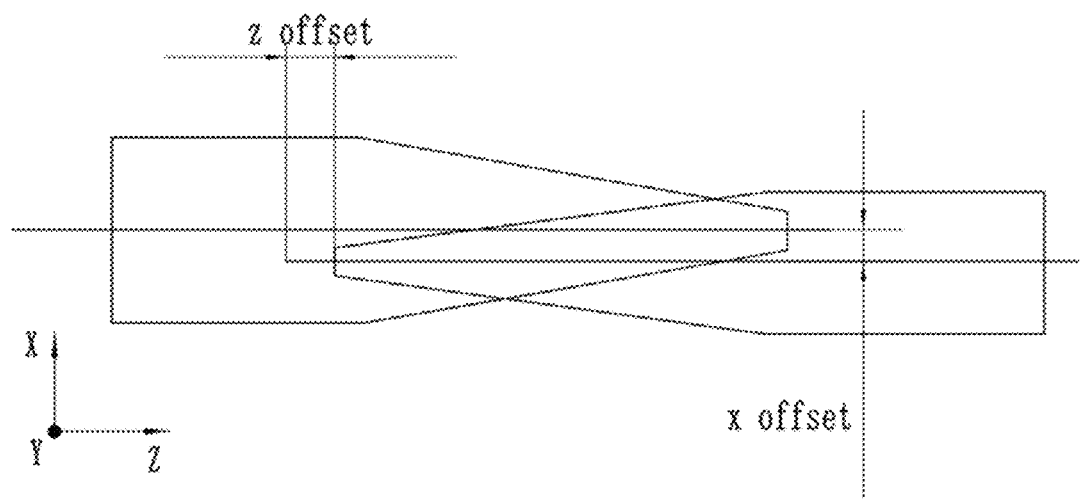
FIG. 10 is a schematic diagram of a horizontal alignment error when fitting the daughterboard chip to the motherboard chip in hybrid integration according to Example 1 of the disclosure.
Figure 11:
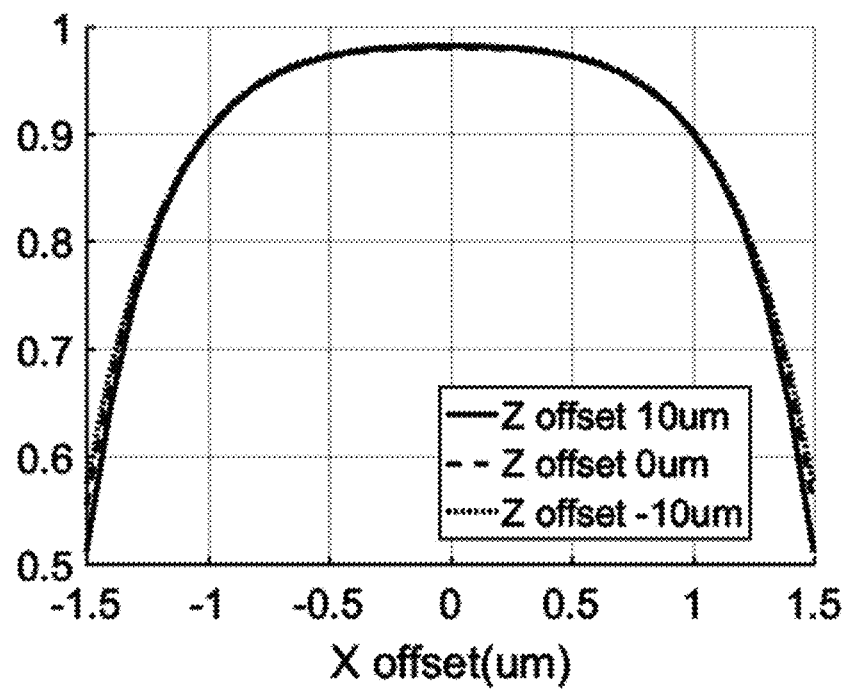
FIG. 11 is a simulation calculation of horizontal alignment error when fitting the daughterboard chip to the motherboard chip in hybrid integration by a beam propagation method (BPM) according to Example 1 of the disclosure.

In the drawings, the following reference numbers are used: 1: first substrate layer; 2: first waveguide cover layer; 3: first metal region; 4: first support member; 5: second support member; 6: first coupling waveguide region; 7: first conventional waveguide region; 8: second substrate layer; 9: daughterboard chip waveguide core layer; 10: second waveguide cover layer; 11: second metal region; 12: third support member; 13: fourth support member; 14: second coupling waveguide region; 15: eutectic welding metal; 16: silicon substrate layer; 17: silicon waveguide core layer; 18: silicon oxide cover layer; 22: first spot-size conversion structure; 23: second spot-size conversion structure; 24: integrated optical circuit waveguide core layer; 25: heat sink; 26: InP-based chip substrate; 27: InP-based chip core layer; 28: InP-based chip cover layer; 29: InP-based chip metal region; 30: InP-based chip coupling waveguide region; 31: fifth support member; 32: sixth support member; 33: third coupling waveguide region; 34: third conventional waveguide region; 35: first welding region; and, 36: second welding region.

DETAILED DESCRIPTION

To further illustrate, embodiments detailing a hybrid integration method are described below. It should be noted that the following embodiments are intended to describe and not to limit the disclosure.

Example 1

With reference to FIGS. 1-12, the disclosure provides a hybrid integration method, comprising the following steps.

A motherboard chip is assembled. The motherboard chip comprises a motherboard chip body. A first metal region 3, a first vertical support assembly and a first waveguide region are arranged on the motherboard chip body. The first waveguide region comprises a first coupling waveguide region 6 used for vertical coupling.

A daughterboard chip is assembled. The daughterboard chip comprises a daughterboard chip body. A second metal region 11, a second vertical support assembly and a second waveguide region are arranged on the daughterboard chip body. The second waveguide region comprises a second coupling waveguide region 14 used for vertical coupling.

An integrated chip is assembled. The daughterboard chip is fitted upside down to the top end of the motherboard chip, the first vertical support assembly is fitted to the second vertical support assembly, the first coupling waveguide region 6 is fitted or approached to the second coupling waveguide region 14, and the first metal region 3 is fixedly connected to the second metal region 11.

In the disclosure, the daughterboard chip is fitted upside down to the motherboard chip, and the second coupling waveguide region is closely fitted or approached to the first coupling waveguide region to form a waveguide vertical coupling state, so that light can be transmitted from the daughterboard chip coupling region to the first coupling waveguide region or from the first coupling waveguide region to the second coupling waveguide region. Thus, hybrid integration is realized by the flip-chip bonding of the motherboard chip and the daughterboard chip and in combination with waveguide vertical coupling. The second coupling waveguide region and the first coupling waveguide region can come into close contact with each other as a support region in the vertical direction during the flip-chip bonding, to form a vertical coupler. Thus, efficient optical coupling is realized by double waveguides formed by completely contacting the second coupling waveguide region with the first coupling waveguide region, and a larger alignment tolerance is achieved. The corresponding metal regions on the daughterboard chip and the motherboard chip are fixedly connected by eutectic welding or metal bonding, so that the daughterboard chip and the motherboard chip are fixedly connected.

As an improvement, during assembling an integrated chip, the second conventional waveguide region and the first conventional waveguide region 7 are arranged on two sides of the vertical waveguide coupler, respectively.

Further, the daughterboard chip and the motherboard chip are independent chips with complete functions and can independently complete the work of the chip. In the disclosure, the daughterboard chip and the motherboard chip are coupled and connected, so that the alignment tolerance between optical chips is increased and the light loss and light reflection are reduced.

Further, corresponding marks or slots used for horizontal alignment are formed on the daughterboard chip and the motherboard chip to ensure the accurate alignment of the daughterboard chip and the motherboard chip in the horizontal direction. A vertical support assembly with the same height is arranged on the motherboard chip, and a vertical support assembly with the same height is correspondingly arranged on the daughterboard chip. The first coupling waveguide region 6 and the second coupling waveguide region 14 are a part of the first vertical support assembly and a part of the second vertical support assembly, respectively, and fitted to each other to support the motherboard chip and the daughterboard chip.

Further, a groove nesting region on the motherboard chip depends on the specific structure of the daughterboard chip. This hybrid integration mode has a larger horizontal alignment tolerance, and is therefore far superior to the waveguide butt coupling mode.

Further, the thickness of the second waveguide cover layer 10 of the second coupling waveguide region 14 and the first waveguide cover layer 2 of the first coupling waveguide region 6 is far less than the thickness of the conventional waveguide region cover layers of the daughterboard chip and the motherboard chip to achieve more efficient coupling. The difference in thickness between the cover layers of the conventional waveguide regions and coupling waveguide regions of the daughter chip and the motherboard chip will often lead to a light transmission loss. The transmission loss of light from the conventional waveguide region to the coupling waveguide region or from the coupling waveguide region to the conventional waveguide region can be reduced by various tapered structures.

Further, the daughterboard chip is placed upside down, and a major region of the daughterboard chip is nested into the groove nesting region of the motherboard chip according to the horizontal alignment marks or slots. The vertical support assemblies of the daughterboard chip and the motherboard chip come into contact with each other and support each other, and the first coupling waveguide region 6 and the second coupling waveguide region 14 are fitted to each other, so that the accurate alignment of the coupling waveguide regions in the vertical direction is realized.

Further, the horizontal alignment of the second coupling waveguide region 14 of the daughterboard chip placed upside down and the corresponding first coupling waveguide region 6 can depend on the marks or slots on the daughterboard chip and the motherboard chip or other optical active/passive alignment methods.

Further, due to the unevenness or warping of the daughterboard chip and the motherboard chip, the first coupling waveguide region 6 and the second coupling waveguide region 14 cannot come into close contact with each other completely when the daughterboard chip is fitted to the motherboard chip. By appropriately applying a pressure to this region, the daughterboard chip and the motherboard chip can be fitted completely.

Further, the first metal region 3 and the second metal region 11 can but not need to provide current or voltage injection for the daughterboard chip, and the position, number and shape of the first metal region 3 and the second metal region 11 can be adaptively altered.

Further, the motherboard chip body comprises a first substrate layer 1. Two first waveguide cover layers 2 are fixedly connected to the top end of the first substrate layer 1, and the groove nesting region is arranged between the two first waveguide cover layers 2. The first vertical support assembly is vertically and fixedly connected to the groove nesting region. The first metal region 3 is fixedly connected to the groove nesting region. The first waveguide region is fixed to the top end of one first waveguide cover layer 2. The first waveguide region comprises a first coupling waveguide region 6 fixedly connected to the top end of the first waveguide cover layer 2 and a first conventional waveguide region 7. The first coupling waveguide region 6 is fixedly connected to the first conventional waveguide region 7, and the first coupling waveguide region 6 is located near one end of the groove nesting region. The first coupling waveguide region 6 is fitted and coupled to the second coupling waveguide region 14.

Further, the first substrate layer 1 is Si having a thickness of 500 μm; the first waveguide region core layer is Si having a thickness of 250 nm, and is isolated from the first substrate layer 1 through a SiO$_2$ layer having a thickness of 2 μm; and, the first waveguide cover layer 2 above the motherboard chip waveguide core layer is SiO$_2$ having a thickness of 150 nm. The cross-sectional structure of the first coupling waveguide region 6 is successively a silicon oxide cover layer 18, a silicon waveguide core layer 17 and a silicon substrate layer 16 from the top down.

Further, the daughterboard chip body comprises a second substrate layer 8. A daughterboard chip waveguide core layer 9 is fixedly connected to the top end of the second substrate layer 8, a second waveguide cover layer 10 is fixedly connected to the top end of the daughterboard chip waveguide core layer 9, and the second metal region 11 is fixedly connected to the top end of the second waveguide cover layer 10. The second vertical support assembly is fixedly connected to the top end of the second substrate layer 8. The second coupling waveguide region 14 is fixed to an end of the second waveguide cover layer 10 away from the second vertical support assembly. When the daughterboard chip is an active device, the second metal region 11 is evaporated on the second waveguide cover layer 10, the first metal region 3 is evaporated in the groove nesting region, and the groove nesting region is generally etched in the first substrate layer 1. When the daughterboard chip placed upside down is fitted to the motherboard chip, the second metal region 11 is completely nested into the groove nesting region of the motherboard chip, and the first metal region 3 completely corresponds to the second metal region 11. By using eutectic welding metal 15, the second metal region 11 and the first metal region 3 are connected by alloy eutectic welding or metal bonding. When the temperature rises, the eutectic welding metal will be molten and softened, so the fixed connection between the second metal region 11 and the first metal region 3 will not hinder the fitting of the vertical support structure and coupling waveguide region of the daughterboard chip to the corresponding vertical support structure and coupling waveguide region of the motherboard chip, and the surface tension of the molten metal can assist in the accurate alignment of the daughterboard chip and the motherboard chip in the horizontal direction. When the temperature drops, the cooling contraction of the metal will further tighten the daughterboard chip and the motherboard chip, so that the contact between the second coupling waveguide region 14 and the first coupling waveguide region 6 becomes closer, and the waveguide coupling efficiency can be kept stable in an environment with a large temperature change. The first metal region 3 is evaporated on the first substrate layer 1, so good heat dissipation is achieved, and the displacement in the vertical direction caused by the change in temperature is small. Thus, light can be transmitted from the second coupling waveguide region 14 to the first coupling waveguide region 6 or from the first coupling waveguide region 6 to the second coupling waveguide region 14.

Further, the second conventional waveguide region consists of a daughterboard chip core layer 9, a daughterboard chip cover layer 10 and a second metal region 11. Light enters the second conventional waveguide region from the second coupling waveguide region 6, or light enters the second coupling waveguide region 14 from the second conventional waveguide region.

Further, the second substrate layer 8 is made of InP, and the daughterboard chip waveguide core layer 9 is made of InGaAsP and has a refractive index of 3.39 and a thickness of 300 nm; the second waveguide cover layer 10 is made of InP, and the second waveguide cover layer 10 in the non-coupling waveguide region has a thickness of 1.5 μm; and, the cross-sectional structure of the second coupling waveguide region 14 is successively the second waveguide cover layer 10, the daughterboard chip waveguide core layer 9 and the second substrate layer 8 from the top down, and the second waveguide cover layer 10 in the second coupling waveguide region has a thickness of 150 nm.

Further, the waveguide ends of the first coupling waveguide region 6 and the second coupling waveguide region 14 are narrowed, so that it is advantageous for efficient light coupling and the light reflection is greatly reduced.

Further, light is transmitted between the daughterboard chip and the motherboard chip within a certain coupling region by vertical waveguide coupling. This vertical coupling mode allows a larger alignment tolerance in the horizontal direction. The alignment tolerance is far greater than that for the butt coupling. During the alignment in the vertical direction, the second coupling waveguide region 14 and the first coupling waveguide region 6 come into close contact with each other and serve as one vertical support structure, so there is no vertical alignment error theoretically.

As a further optimized solution, during assembling an integrated chip, the first coupling waveguide region 6 is fitted or approached to the second coupling waveguide region 14 to form a vertical waveguide coupler, and light transits from the motherboard chip to the daughterboard chip or from the daughterboard chip to the motherboard chip through the vertical waveguide coupler.

Further, during hybrid integration, even if the second coupling waveguide region 14 is not located above the first coupling waveguide region 6, high optical coupling efficiency can still be achieved by a coupling region with a certain length and a certain width.

As a further optimized solution, during assembling an integrated chip, the principle of optical coupling after the first coupling waveguide region 6 is fitted or approached to the second coupling waveguide region 14 includes, but is not limited to, directional coupling, evanescent coupling or adiabatic coupling. The suitable waveguide coupling method can be selected according to different material systems and structures. For example, when the effective refractive index of the second coupling waveguide mode is close to that of the first coupling waveguide mode, adiabatic coupling or directional coupling can be selected; and, when the effective refractive index of the first coupling waveguide mode is quite different from that of the first coupling waveguide mode, evanescent coupling can be selected.

Further, the coupling waveguide regions of the daughterboard chip and the motherboard chip can be types of ridge waveguide to optimize the vertical support structure, so that it is easier to completely fit the coupling waveguide regions; or, the coupling waveguide regions of the daughterboard chip and the motherboard chip can be types of buried waveguide, so that the coupling waveguides can tolerate a larger vertical pressure and the structure is more stable. The coupling waveguides of the daughterboard chip and the motherboard chip can also be in other waveguide forms according to actual needs.

Further the first vertical support assembly includes, but is not limited to, a first support member 4 and a second support member 5. The number, position and shape of the vertical support assembly on the motherboard chip can be adjusted according to actual needs.

Further, the second vertical support assembly includes, but is not limited to, a third support member 12 and a fourth support member 13. The number, position and shape of the second vertical support assembly can be adjusted according to actual needs. The vertical support assembly of the daughterboard chip is arranged in correspondence to the vertical support assembly of the motherboard chip.

Further, the first support member 4 and second support member 5 of the motherboard chip and the first coupling waveguide region 6 can be etched in the same fabrication step to ensure height consistency; and, the third support member 12 and fourth support member 13 of the daughterboard chip and the second coupling waveguide region 14 can also be etched in the same fabrication step to ensure height consistency.

Further, light on the daughterboard chip will be coupled from the daughterboard chip waveguide core layer 9 to the silicon waveguide core layer 17 in the Z direction, and the second waveguide cover layer 10 of the daughterboard chip made of an InP-based material is closely fitted to the silicon oxide cover layer 18 of the motherboard chip.

Further, this example adopts, but is not limited to, evanescent coupling. The fitting width of the first coupling waveguide region 6 gradually changes from 0.2 μm to 1.5 μm, the width of the second coupling waveguide region 14 gradually changes from 4 μm to 0.2 μm, and the total length of upper and lower waveguide coupling regions (the overlapped region of the second coupling waveguide region 14 and the first coupling waveguide region 6) is 470 μm. The coupling efficiency is simulated by a beam propagation method. During simulation, the length of conventional waveguide regions at two ends of the waveguide coupling region is set to be 10 μm in order to monitor the power in the conventional waveguide regions of the daughterboard chip and the motherboard chip. The fundamental mode in the InP waveguide is coupled into the lower silicon waveguide through the vertical waveguide coupler formed by fitting the coupling waveguide regions. The coupling efficiency is greater than 98%.

Further, the alignment tolerance when the daughterboard chip is approached to the motherboard chip is the key of hybrid integration. In this method, as one support structure in the vertical direction, the first coupling waveguide region 6 and the second coupling waveguide region 14 have theoretically no alignment error in the vertical direction. Even if the coupling waveguide regions are not fitted completely due to the unevenness or warping of the daughterboard chip or the motherboard chip, a pressure can be appropriately applied above the second coupling waveguide region 14, and the coupling waveguide regions can be tightened by using contraction during eutectic welding or bonding metal cooling so that the coupling waveguide regions are completely fitted. Therefore, the alignment tolerance in the vertical direction will not be taken into consideration. In the horizontal direction, there will be alignment errors in two dimensions, i.e., z-compensation in the propagation direction and x-compensation in the waveguide width direction. The coupling efficiency in the presence of the z-compensation and x-compensation is calculated by a beam propagation method, respectively. The results show that the alignment tolerance Z-compensation in the light transmission direction is very large, which is far superior to that of the butt coupling solution. The error in the coupling waveguide width direction is within ±1 μm, and the increase of coupling loss is not more than 10% (about 0.5 dB), which is also superior to the increase of coupling loss by 2.3 dB in the butt coupling.

Further, the second coupling waveguide region 14 and the first coupling waveguide region 6 adopt, but are not limited to, buried waveguide, shallow ridge waveguide, deep ridge waveguide or other waveguide forms.

Further, the number and position of the second coupling waveguide region 14 and the first coupling waveguide region 6 can be set according to actual needs.

Further, the width and length of the second coupling waveguide region 14 and the first coupling waveguide region 6 can be designed according to the specific structure parameters of the actual waveguide region to achieve better coupling efficiency and a larger alignment tolerance. The larger the length of the coupling region is, the larger the alignment tolerance in the horizontal direction is. However, a too long coupling region is disadvantageous for flip-chip bonding, so it is necessary to compromise the parameters of the coupling waveguide region.

Further, the thickness of the waveguide cover layer 10 of the second coupling waveguide region and the waveguide cover layer 2 of the first coupling waveguide region is optimized according to the specific structure parameters of the waveguide region. Thus, the waveguide region core layer can be protected, the stable waveguide fundamental model can be transmitted, and the better coupling efficiency between the coupling waveguides of the daughterboard chip and the motherboard chip can be ensured.

As a further optimized solution, during assembling an integrated chip, a manner of forming the first metal region 3 and the second metal region 11 includes, but is not limited to, metal evaporation, sputtering or electroplating.

Further, the optical second metal region 11 is connected to the optical first metal region 3 by eutectic welding or metal bonding. When the temperature drops after high-temperature bonding, the metal will contract to realize closer fitting of the daughterboard chip and the motherboard chip. The first metal region 3 is generally evaporated on the material of the first substrate layer 1, for example, on the silicon material, to achieve better heat dissipation. If this hybrid integration method is operated in an environment with a large temperature change, the alignment error in the vertical direction caused by thermal expansion and cold contraction is small, so that good coupling efficiency can still be achieved.

Figure 12:
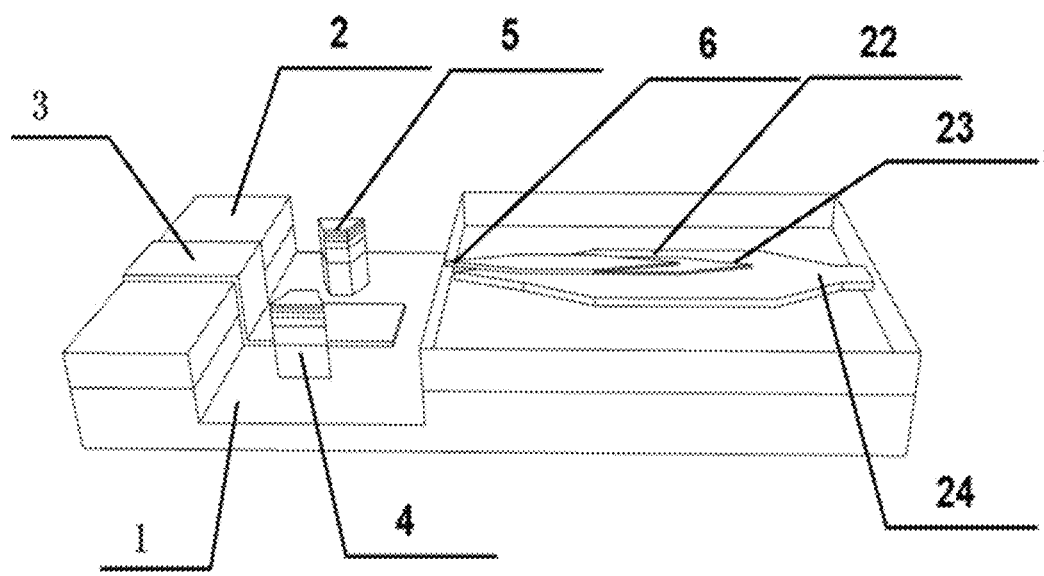
FIG. 12 is a schematic structure diagram of transmitting light on a motherboard chip from a high-refractive-index vertical coupling waveguide region core layer to an integrated optical circuit waveguide region core layer according to Example 1 of the disclosure.

Further, the silicon waveguide core layer 17 of the optical motherboard chip can be made of silicon, amorphous silicon or other materials with a high refractive index and a low loss, so that light in the optical second coupling waveguide region is easily vertically coupled into the optical motherboard coupling waveguide region with a high refractive index. However, in addition to silicon, the material of the integrated optical circuit waveguide core layer 24 widely used at present also comprises some materials with a relatively low refractive index, such as silicon nitride and lithium niobate. If these materials are directly used as the material of the first coupling waveguide region 6 and then aligned and fitted with the second coupling waveguide region 14 to form a vertical coupler, the required coupling waveguide is relatively long, and the alignment tolerance will be reduced. Therefore, the materials with a high refractive index such as amorphous silicon can still be used as the material of the first coupling waveguide region 6. After the vertical coupler formed by bonding couples light from the daughterboard chip to the motherboard chip, the light is gradually transferred from the high-refractive-index coupling waveguide to the integrated optical circuit waveguide by one or more spot-size converters. FIG. 12 shows all the motherboard chip structure in FIG. 1. The first coupling waveguide region is connected to a first spot-size conversion structure 22, a second spot-size conversion structure 23 and an integrated optical circuit waveguide core layer 24. Considering the material growth, the first coupling waveguide region 6 and the integrated optical circuit waveguide core layer 24 are generally isolated by a silicon oxide cover layer 18. Based on the motherboard chip structure of FIG. 12, the hybrid integration of mainstream passive optical circuit chips and active device chips at present can be realized.

Example 2

Figure 13:
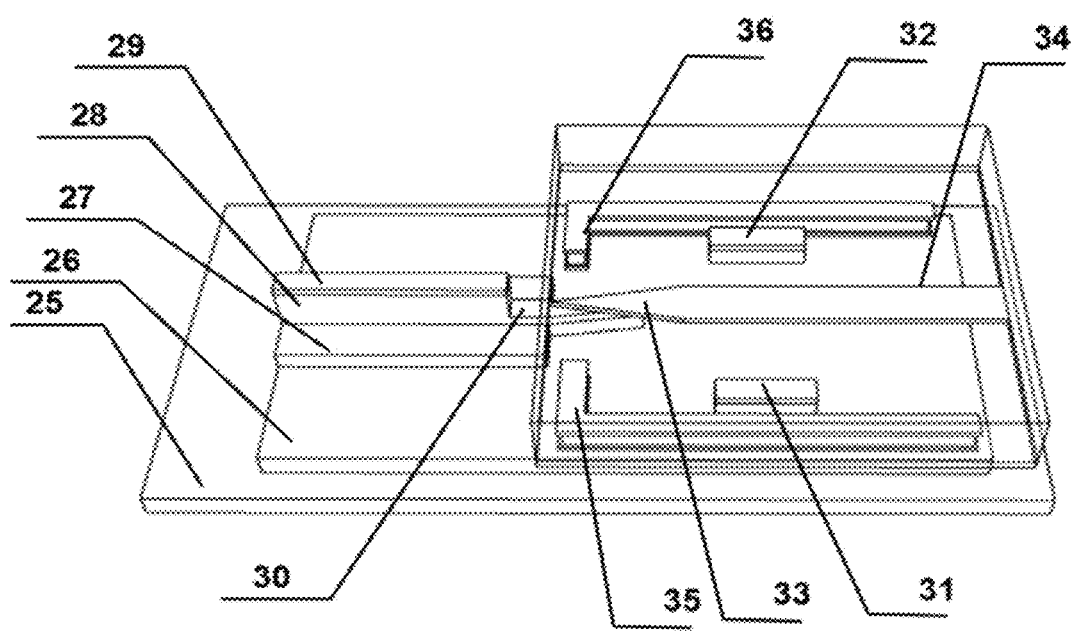
FIG. 13 is a three-dimensional structure diagram of a device after hybrid integration according to Example 2 of the disclosure.

As shown in FIG. 13, Example 2 is based on Example 1, where a silicon-based waveguide chip is used as the daughterboard chip, an InP-based chip is used as the optical motherboard chip, which is opposite to the arrangement of the daughterboard and motherboard chips in Example 1. The motherboard chip comprises a motherboard chip body and a motherboard chip coupling region. The motherboard chip body comprises a heat sink 25. An InP-based chip substrate 26, an InP-based chip core layer 27, an InP-based chip cover layer 28 and an InP-based chip metal region 29 are successively arranged at the top end of the heat sink 25. The motherboard chip coupling region comprises an InP-based chip coupling waveguide region 30. A first vertical support assembly is arranged on the motherboard chip. The first vertical support assembly incudes, but is not limited to, a fifth support member 31 and a sixth support member 32. The daughterboard chip comprises a daughterboard chip body and a daughterboard chip coupling region. The daughterboard chip body comprises a second vertical support assembly. The daughterboard chip coupling region comprises a third coupling waveguide region 33 and a third conventional waveguide region 34. A first welding region 35 and a second welding region 36 are arranged between the daughterboard chip and the motherboard chip.

The thinned InP-based chip faces upward, and is welded to the corresponding heat sink 25 by rear metal to serve as the motherboard chip. The silicon-based waveguide chip is used as the daughterboard chip and arranged upside down on the InP-based chip as the motherboard chip. On the InP-based chip, there are the InP-based chip coupling waveguide region 30 and the first vertical support assembly which have the same height. The third coupling waveguide region 33 and the second vertical support assembly are arranged on the silicon-based waveguide chip. The daughterboard chip and the motherboard chip are fitted together up and down. The first support member 31 and the sixth support member 32 both having the same height on the InP-based chip support the silicon-based waveguide chip to realize the alignment in the vertical direction. The number, position and mounting region of the fifth support member 31 and the sixth support member 32 can be adaptively adjusted according to actual needs as long as the same height as the third coupling waveguide region 33 can be realized. The first welding region 35 and the second welding region 36 comprise metal regions which correspond to each other and are located on the InP-based chip and the silicon-based waveguide chip. Each pair of metal regions is connected by eutectic welding or metal bonding, so that the structure is more stable. The alignment of the daughterboard chip and the motherboard chip in the horizontal direction is realized by marks. Light is coupled into the silicon-based waveguide chip from the InP-based chip coupling waveguide region 30, and the coupling waveguide region of the hybrid integrated device has the same structure as that in Example 1. It is to be pointed out that, the waveguide cover layer of the third coupling waveguide region 33 is very thin, so it is advantageous for light coupling. If light is vertically coupled in the coupling waveguide region and then enters the conventional waveguide region, the waveguide cover layer can be thicker here. The transmission loss of light from the coupling waveguide region to the conventional waveguide region can be reduced by various tapered structures.

The coupling waveguide region in Example 2 is the same as that in Example 1, and also has high coupling efficiency and alignment tolerance. Compared with Example 1, Example 2 is advantageous in two aspects. Firstly, since the InP-based chip substrate 26 is directly welded to the heat sink, a better heat dissipation capability is achieved, and the chip operates more stably. This solution is more suitable for the InP-based chip that requires high-speed electrical connection. Secondly, when the daughterboard chip and the motherboard chip are aligned and fitted, the InP-based chip on the heat sink can operate normally (e.g., lasing of a laser). If a fixed optical fiber is already coupled at the tail end of the silicon-based waveguide chip, the other end of this optical fiber is connected to a detector. In this case, the active alignment can be realized, and it can be determined according to the reading of the detector whether the fitting position of the daughterboard chip and the motherboard chip is accurate, thereby achieving a higher yield.

It will be obvious to those skilled in the art that changes and modifications may be made, and therefore, the aim in the appended claims is to cover all such changes and modifications.

What is claimed is:

1. A method, comprising:
   assembling a motherboard chip, the motherboard chip comprising a motherboard chip body, a first metal region, a first vertical support assembly, and a first waveguide region being arranged on the motherboard chip body, and the first waveguide region comprising a first conventional waveguide region and a first coupling waveguide region used for vertical coupling which are fixedly connected to each other;
   assembling a daughterboard chip, the daughterboard chip comprising a daughterboard chip body, a second metal region, a second vertical support assembly and a second waveguide region being arranged on the daughterboard chip body, and the second waveguide region comprising a second conventional waveguide region and a second coupling waveguide region used for vertical coupling which are fixedly connected to each other; and
   assembling an integrated chip: fitting the daughterboard chip upside down to a top end of the motherboard chip, fitting the first vertical support assembly to the second vertical support assembly, fitting or approaching the first coupling waveguide region to the second coupling waveguide region to form a vertical waveguide coupler, and fixedly connecting the first metal region to the second metal region.

2. The method of claim 1, wherein during assembling the integrated chip, the first coupling waveguide region is fitted or approached to the second coupling waveguide region to form the vertical waveguide coupler; light enters the first coupling waveguide region from the first conventional waveguide region, then transits from the first coupling waveguide region to the second coupling waveguide region through the vertical waveguide coupler, and enters the second conventional waveguide region from the second coupling waveguide region; or, light enters the second coupling waveguide region from the second conventional waveguide region, then transits from the second coupling waveguide region to the first coupling waveguide region through the vertical waveguide coupler, and enters the first conventional waveguide region from the first coupling waveguide region.

3. The method of claim 2, wherein during assembling the integrated chip, a principle of optical coupling after the first coupling waveguide region is fitted or approached to the second coupling waveguide region comprises directional coupling, evanescent coupling or adiabatic coupling.

4. The method of claim 1, wherein during assembling the integrated chip, the second conventional waveguide region and the first conventional waveguide region are arranged on two sides of the vertical waveguide coupler, respectively.

5. The method of claim 1, wherein during assembling the integrated chip, a manner of fixedly connecting the first metal region to the second metal region comprises eutectic welding or metal bonding.

6. The method of claim 5, wherein during assembling the integrated chip, a manner of forming the first metal region and the second metal region comprises metal evaporation, sputtering or electroplating.

7. The method of claim 5, wherein during assembling the integrated chip, the fixed connection between the first metal region and the second metal region neither hinders the fitting of the second vertical support assembly with the first vertical support assembly nor hinders the fitting or approach of the first coupling waveguide region to the second coupling waveguide region.

* * * * *